(12) United States Patent
Kawabata

(10) Patent No.: US 8,125,792 B2
(45) Date of Patent: Feb. 28, 2012

(54) SUBSTRATE FOR WIRING, SEMICONDUCTOR DEVICE FOR STACKING USING THE SAME, AND STACKED SEMICONDUCTOR MODULE

(75) Inventor: Takeshi Kawabata, Osaka (JP)

(73) Assignee: Panasonic Corporation, Osaka (JP)

( * ) Notice: Subject to any disclaimer, the term of this patent is extended or adjusted under 35 U.S.C. 154(b) by 634 days.

(21) Appl. No.: 12/330,686

(22) Filed: Dec. 9, 2008

(65) Prior Publication Data

US 2009/0147490 A1 Jun. 11, 2009

(30) Foreign Application Priority Data

Dec. 10, 2007 (JP) ................. 2007-317797

(51) Int. Cl.
*H05K 7/00* (2006.01)
(52) U.S. Cl. .................. 361/783; 361/792; 174/261

(58) Field of Classification Search .......... 174/260–266, 174/255, 250; 361/790, 792, 795, 772, 767, 361/748, 728, 729, 735, 736; 257/686, 678, 257/690, 685, 723, 777, 784
See application file for complete search history.

(56) References Cited

U.S. PATENT DOCUMENTS 5,306,948 A 4/1994 Yamada et al. ............... 257/690
(Continued)

FOREIGN PATENT DOCUMENTS

JP 9-223725 8/1997
(Continued)

*Primary Examiner* — Hoa C Nguyen
(74) *Attorney, Agent, or Firm* — Panasonic Patent Center; Dhiren Odedra; Kerry Culpepper

(57) ABSTRACT

In a stacked semiconductor module, a test covering connecting terminals is easily conducted and high reliability is achieved.

16 Claims, 7 Drawing Sheets

U.S. PATENT DOCUMENTS

| | | | |
|---|---|---|---|
| 5,334,857 A * | 8/1994 | Mennitt et al. | 257/48 |
| 5,530,278 A | 6/1996 | Jedicka et al. | 257/432 |
| 6,448,664 B1 * | 9/2002 | Tay et al. | 257/780 |
| 6,545,228 B2 | 4/2003 | Hashimoto | 174/260 |
| 6,580,092 B2 | 6/2003 | Tomishima | 257/48 |
| 6,764,879 B2 | 7/2004 | Nagao et al. | 438/110 |
| 7,087,989 B2 | 8/2006 | Nakayama | 257/686 |
| 2004/0161865 A1 * | 8/2004 | Yu et al. | 438/14 |
| 2006/0202201 A1 * | 9/2006 | Maruyama | 257/48 |

FOREIGN PATENT DOCUMENTS

| | | |
|---|---|---|
| JP | 2004-281633 | 10/2004 |

* cited by examiner

SUBSTRATE FOR WIRING, SEMICONDUCTOR DEVICE FOR STACKING USING THE SAME, AND STACKED SEMICONDUCTOR MODULE

FIELD OF THE INVENTION

The present invention relates to a semiconductor device for stacking disposed at the bottom layer when a plurality of semiconductor devices are stacked, a substrate for wiring used for the semiconductor device for stacking, and a stacked semiconductor module using the semiconductor device for stacking.

BACKGROUND OF THE INVENTION

In recent years, electronic components with higher functionality have been demanded in response to size reduction and improved functionality of electronic equipment such as mobile phones and digital cameras. Particularly, as lamination techniques for semiconductor chips have been improved, stacked semiconductor modules in which a plurality of semiconductor chips are stacked and integrated have been developed with higher functionality.

For example, Japanese Patent Laid-Open No. 2004-363126 discloses the configuration of a stacked semiconductor module. In this configuration, a first semiconductor package in which a first semiconductor chip is mounted and a second semiconductor package in which a second semiconductor chip is mounted are stacked.

In the manufacturing of such a stacked semiconductor module, a test is conducted after the semiconductor packages are stacked. When the semiconductor module is judged to be defective in this test, the whole stacked semiconductor module has to be discarded as a reject or it is necessary to temporarily separate the mounting portions of the first and second semiconductor packages, package the semiconductor packages again, and then conduct a test again, resulting in a low yield in the manufacturing process.

Thus it is necessary to conduct a test for guaranteeing the reliability of semiconductor devices before stacking the semiconductor devices. For this reason, semiconductor devices which can be tested thus have been demanded.

For example, Japanese Patent Laid-Open No. 2004-281633 discloses the configuration of a stacked semiconductor module in which a plurality of chips are stacked and mounted. Each of the chips has mounting terminals and test terminals for quality inspection on the first major surface, mounting pads to be connected, on the second major surface, to the mounting terminals of another chip, and test pads electrically connected to the test terminals on the first major surface.

With this configuration, it is possible to conduct a test in a state in which the test pads of a first chip mounted on a substrate and the test terminals of a second chip mounted on the first chip are joined to each other. In other words, the test can be conducted by inputting a test signal to the test terminals of the first chip from the substrate and then inputting the test signal to the test terminals of the second chip through the test pads of the first chip.

When the semiconductor module is found to be non-defective in the test, the tested second chip is moved on the first chip and the mounting terminals of the second chip are connected to the mounting pads of the first chip to mount the second chip.

In this stacked semiconductor module, the chips are mounted directly on the substrate but packages having chips mounted therein are not stacked on top of each other.

Japanese Patent Laid-Open No. 2002-83897 discloses a configuration which can easily test electrical characteristics. In this configuration, a wiring pattern is formed on a substrate having a larger outside shape than a semiconductor chip, the semiconductor chip is mounted on the substrate, and the semiconductor chip and the first and second terminals of the substrate are electrically connected to each other.

The first terminals are disposed outside a region where the semiconductor chip is mounted, and are exposed on one side of the substrate. The second terminals are disposed in the region where the semiconductor chip is mounted, and are exposed, on the other side of the substrate, in through holes formed on the substrate.

In this semiconductor device, the first terminals can be used for electrical connection to other members, and the second terminals can be used for testing electrical characteristics. However, a test covering the first terminals cannot be conducted.

Japanese Patent Laid-Open No. 9-223725 discloses a grid array semiconductor package. In this semiconductor package, a semiconductor device has signal pins arranged in a grid array on the underside of the body, and is surface mounted by joining the signal pins and the circuit pattern of a circuit board. The semiconductor device includes contact pads electrically connected to the signal pins and disposed on the front side of the body.

This configuration facilitates a continuity test for checking the connection of the signal pins and the circuit pattern of the circuit board during surface mounting, and facilitates an electrical test conducted on the semiconductor package after the semiconductor package is fabricated.

However, when such a configuration is used for a stacked semiconductor module, the contact pads used as connecting terminals for stacking may be scratched by probes coming into contact with the contact pads, so that a faulty connection may occur. Further, since each semiconductor device has to be tested, the cost of testing equipment increases.

Japanese Patent Laid-Open No. 2003-124274 discloses a configuration for testing a semiconductor wafer. In this configuration, an electrode pad for a connecting terminal is provided in each chip region on the semiconductor wafer and a test pad is provided outside the chip region.

Thus it is possible to reduce the area of the test pad on the semiconductor chip, thereby reducing the size of the semiconductor chip and the size of a semiconductor device using the semiconductor chip.

However, in a stacked semiconductor device, a three-dimensional wiring configuration on a substrate for wiring is important in quality, which has not been particularly disclosed.

The present invention has been devised to solve the foregoing problems. An object of the present invention is to provide a substrate for wiring, a semiconductor device for stacking using the same, and a stacked semiconductor module which can facilitate a test on the connecting terminals of the semiconductor device for stacking used for the stacked semiconductor module, improve the reliability of the stacked semiconductor module, and achieve an inexpensive manufacturing process.

DISCLOSURE OF THE INVENTION

In order to solve the problems, a substrate for wiring according to the present invention includes: first connecting terminals and second connecting terminals on one of opposed major surfaces of the substrate, the second connecting terminals being electrically connected to the first connecting terminals; and external electrode terminals disposed on the other major surface and electrically connected to the second connecting terminals, wherein the first connecting terminals, the second connecting terminals, and the external electrode terminals are disposed in a region to be formed into a piece of the substrate after dicing, the substrate further including a test terminal in a region outside the region to be formed into the piece, the test terminal being electrically connected to the second connecting terminal.

Thus when the substrate for wiring is used for a semiconductor device for stacking, a test is conducted by bringing test probes into contact with the test terminal and the external electrode terminals, thereby guaranteeing wiring paths from the external electrode terminals to the second connecting terminals. The test terminal is provided separately from the second connecting terminals and is disposed on a position that becomes unnecessary after dicing, that is, out of the region of the piece, so that the second connecting terminals are not scratched during a test.

Further, the test terminal is connected to a plurality of second connecting terminals.

With this configuration, a continuity test can be conducted on the plurality of external electrode terminals and the second connecting terminals by testing the single test terminal with a probe. Thus the test with the probe can be efficiently performed before the substrate for wiring is divided, and the cost can be reduced.

Moreover, the second connecting terminal is connected to the midpoint of a wiring path between the first connecting terminal and the external electrode terminal, and the first connecting terminal, the second connecting terminal, and the external electrode terminal are connected in series on the wiring path, the substrate further including a test wire connected to a wiring path other than the wiring path where the first connecting terminal, the second connecting terminal, and the external electrode terminal are connected in series.

Thus on the wiring path where the first connecting terminal, the second connecting terminal, and the external electrode terminal are connected in series, continuity can be guaranteed between the first connecting terminal and the second connecting terminal and between the second connecting terminal and the external electrode terminal.

Thus in a normal test conducted on each piece after a semiconductor chip is mounted, the test may be conducted only on the test terminal and the external electrode terminals other than the wiring path where the first connecting terminal, the second connecting terminal, and the external electrode terminal are connected in series, by bringing test probes into the test terminal and the external electrode terminals.

Thus the number of test wires can be reduced, thereby suppressing an increase in the wiring density of the substrate. The number of test terminals (pads) can be also reduced, thereby reducing the cost of test.

A substrate for wiring according to the present invention includes: first connecting terminals and second connecting terminals on one of opposed major surfaces of the substrate, the second connecting terminals not being connected to the first connecting terminals; and external electrode terminals disposed on the other major surface and electrically connected to the second connecting terminals, wherein the first connecting terminals, the second connecting terminals, and the external electrode terminals are disposed in a region to be formed into a piece of the substrate after dicing, the substrate further including a test terminal in a region outside the region to be formed into the piece, the test terminal being electrically connected to the second connecting terminal.

With this configuration, a test is conducted by bringing test probes into contact with the test terminal and the external electrode terminals, so that wiring paths from the external electrode terminals to the second connecting terminals can be guaranteed and the second connecting terminals are not scratched during the test.

Further, the substrate for wiring includes a test wire for connecting the second connecting terminal and the test terminal, in an inner layer of the substrate in the region to be formed into the piece after dicing.

With this configuration, it is possible to prevent the test wire from being damaged by contact with external members in a manufacturing process and other handling, thereby reducing a probability that damage on the test wire reduces a yield.

Moreover, the substrate for wiring further includes a test wire electrically connected to the test wire of at least another piece, in the region outside the region to be formed into the piece after dicing.

Thus it is not necessary to provide test terminals for the respective pieces. The test terminals can be integrated by drawing the test wires from the pieces, so that a single test terminal can be shared by the plurality of pieces. A continuity test is conducted between the shared test terminal and the external connection terminal of each of the pieces, so that the cost of test can be considerably reduced.

Further, the substrate for wiring includes a test wire formed by selectively using a predetermined part of a wire for electrolytic plating.

Thus in the substrate for wiring using electrolytic plating, a plated lead wire on the substrate for wiring may be selectively used without providing another test wire, thereby suppressing an increase in the cost of the substrate for wiring.

A semiconductor device for stacking according to the present invention, wherein a semiconductor chip is mounted on the substrate for wiring according to any one of the foregoing configurations, and the semiconductor chip and the first connecting terminals are electrically connected to each other.

With this configuration, continuity on wiring paths from the external electrode terminals to the second connecting terminals can be guaranteed beforehand. Thus it is possible to provide a high-quality semiconductor device for stacking without causing a test mark or damage on the surfaces of the second connecting terminals.

A stacked semiconductor module of the present invention, wherein a second semiconductor device is stacked on the semiconductor device for stacking, and the second semiconductor device and the second connecting terminals are electrically connected to each other.

With this configuration, the wiring paths from the external electrode terminals to the second connecting terminals are guaranteed and the second semiconductor device is stacked in a state in which the surfaces of the second connecting terminals are free from test marks and damage. Thus it is possible to provide a stacked semiconductor module having high-quality connections.

According to the present invention, in the substrate for wiring and the semiconductor device for stacking using the same, the wiring paths used for stacking are electrically guaranteed before stacking. Further, a test mark or damage does not occur directly on the connecting terminals used for stacking. Moreover, a test can be efficiently conducted and the cost of test can be reduced. Therefore, in the fabrication of the stacked semiconductor module, it is possible to improve reliability and a yield and reduce the cost, thereby achieving a remarkable effect of easily realizing electronic equipment with demanded higher functionality.

DESCRIPTION OF THE EMBODIMENTS

Figure 1A:
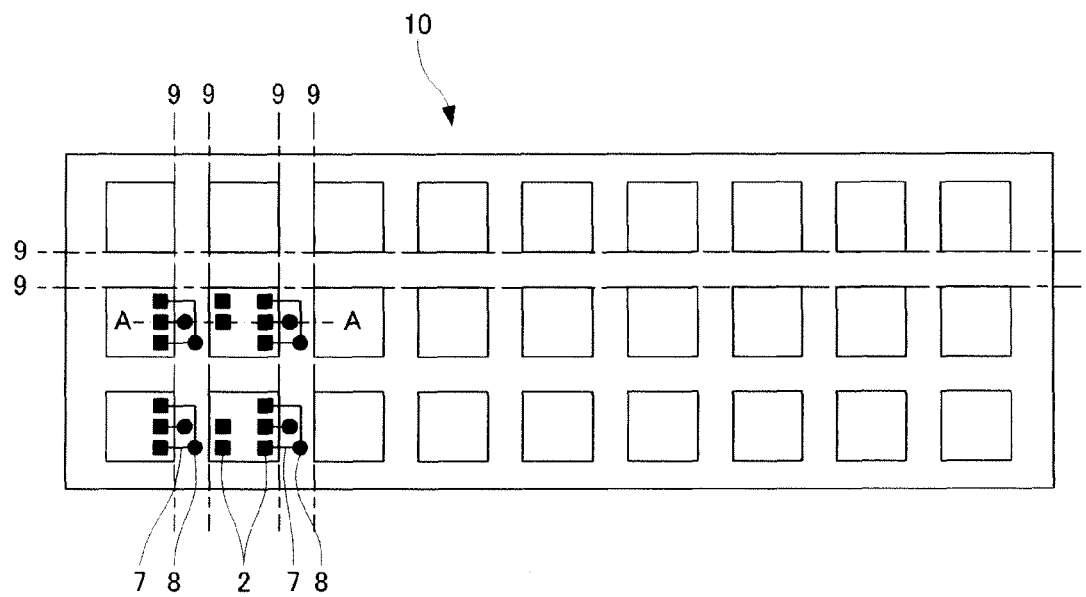
FIG. 1A is a plan view showing a substrate for wiring of a first example according to a first embodiment of the present invention.

Embodiments of the present invention will now be described with reference to the accompanying drawings. In the following embodiments, the same constituent elements are indicated by the same reference numerals and the explanation thereof may be omitted.

The illustrated constituent elements have different thicknesses, lengths, and so on from the actual shapes for convenience in preparing the drawings. Further, the connecting electrodes of a semiconductor chip, the connecting terminals of a substrate, a wiring pattern, vias, and so on may be omitted or the numbers and shapes of these constituent elements may be changed for illustration.

First Embodiment

Figure 1B:
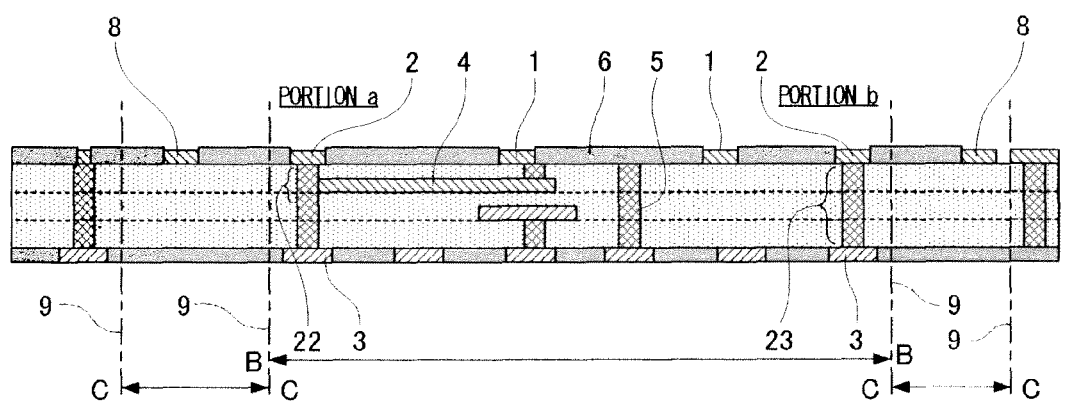
FIG. 1B is a sectional view taken along line A-A of FIG. 1A.

FIGS. 1A and 1B show the configuration of a substrate for wiring according to a first example of a first embodiment. FIG. 1A is a plan view and FIG. 1B is an enlarged sectional view taken along line A-A of FIG. 1A.

In FIGS. 1A and 1B, reference numeral 1 denotes first connecting terminals (omitted in FIG. 1A), reference numeral 2 denotes second connecting terminals, reference numeral 3 denotes external electrode terminals, reference numeral 4 denotes substrate wiring, reference numeral 5 denotes vias vertically connecting upper and lower wiring, and reference numeral 6 denotes solder resist partially covering a wiring surface. Further, reference numeral 7 denotes test wires, reference numeral 8 denotes test terminals (pads), reference numeral 9 denotes dicing lines for dividing the substrate, and reference numeral 10 denotes the substrate for wiring.

In FIGS. 1A and 1B, the substrate 10 for wiring has front and back major surfaces opposed to each other and partially covered with the solder resist 6. The first connecting terminals 1, the second connecting terminals 2, and the test terminals 8 are exposed on one of the major surfaces of the substrate 10 for wiring, and the external electrode terminals 3 are exposed on the other major surface of the substrate 10 for wiring.

The second connecting terminals 2 and the external electrode terminals 3 are electrically connected to each other through the vias 5, the second connecting terminals 2 and the test terminals 8 are electrically connected to each other through the test wires 7, and the test terminals 8 are disposed outside the dividing dicing lines 9.

The first connecting terminals 1 are connected to semiconductor chip electrodes after a semiconductor chip (not shown) is mounted, and the second connecting terminals 2 are connected to the external electrode terminals of another semiconductor device.

After the substrate 10 for wiring is cut along the dicing lines 9, as shown in FIG. 1B, a portion indicated by line B-B corresponds to a piece of the substrate and portions indicated by lines C-C are unnecessary and are not left after the substrate 10 for wiring is divided. In a region corresponding to a piece, the external electrode terminals 3 and the second connecting terminals 2 are electrically connected to each other through the vias 5. The second connecting terminals 2 on the side of a portion "a" in FIG. 1B are electrically connected to the first connecting terminals 1 through the substrate wiring 4, and the second connecting terminals 2 on the side of a portion "b" in FIG. 1B are not electrically connected to the first connecting terminals 1 but are electrically connected through the test wires 7 to the test terminals 8 in a region outside the dicing line 9. After the substrate 10 for wiring is divided, the test wires 7 are partially left in the piece and the cut surfaces of the test wires 7 may be exposed on a side of the piece. The terminals and wires are arranged so as not to leave the test terminals 8 after the substrate for wiring is divided.

Figure 2A:
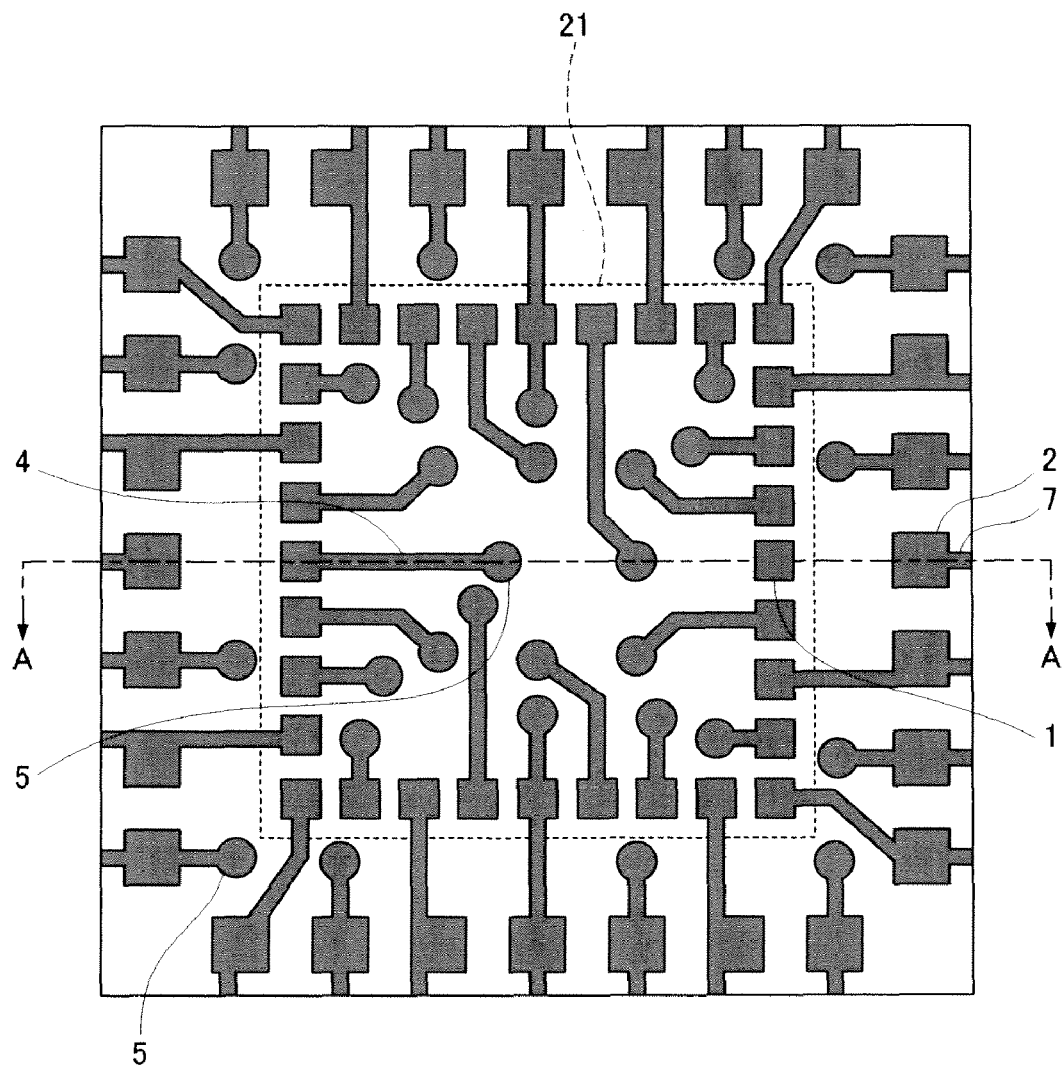
FIG. 2A is a plan view showing a piece of the substrate for wiring of the first example.
Figure 2B:
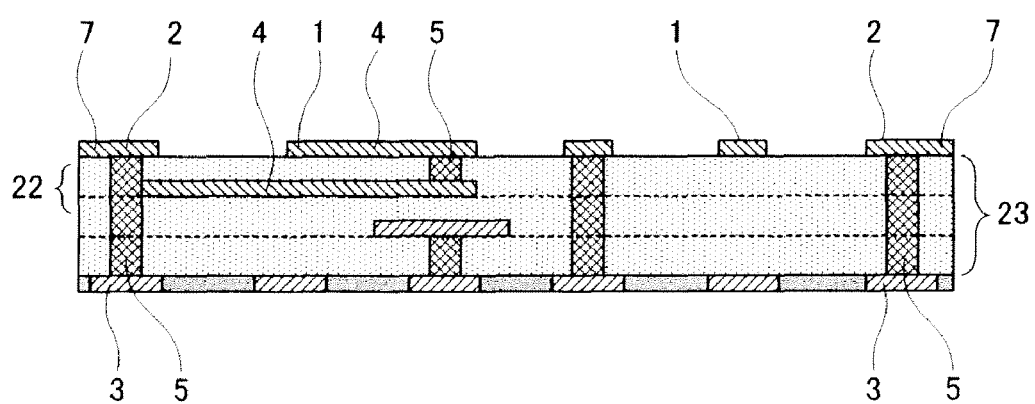
FIG. 2B is a sectional view showing the piece of the substrate for wiring of the first example.

FIGS. 2A and 2B show the piece after dicing according to the first example. FIG. 2A is a plan view and FIG. 2B is a sectional view taken along arrows A-A of FIG. 2A.

In FIGS. 2A and 2B, a dotted line portion 21 indicates an area where the semiconductor chip (not shown) is mounted. The substrate 10 for wiring is actually divided after the semiconductor chip is mounted, and only the substrate for wiring in the piece is enlarged in FIGS. 2A and 2B.

As shown in FIGS. 2A and 2B, the test wires 7 extend from the second connecting terminals 2 to the outside and the cut surfaces of the test wires 7 may be exposed on a side of the piece. In FIG. 2B, the solder resist 6 is omitted from the surface layer of the substrate to simplify the illustration.

In the configuration of the first example, by conducting a test with test probes bought into contact with the test terminal 8 and the external electrode terminal 3 in a state in which the semiconductor chip is mounted on the substrate 10 for wiring, it is possible to guarantee wiring paths from the external electrode terminals 3 to the second connecting terminals 2.

In a prior art configuration, that is, when the test wires 7 of the present example are not provided, even a continuity test between the external electrode terminal 3 and the first connecting terminal 1 on the side of the portion "a" in FIG. 1B cannot guarantee, for example, a wiring portion indicated by reference numeral 22 in FIG. 1B. Thus the entire wiring paths from the external electrode terminals 3 to the second connecting terminals 2 cannot be completely guaranteed.

Also on the side of the portion "b" in FIG. 1B, a wiring path 23 from the external electrode terminal 3 to the second connecting terminal 2 cannot be completely guaranteed without testing the second connecting terminal 2 and the external electrode terminal 3 directly with probes.

Further, in the present example, a test is conducted by bringing probes into contact with the test terminals 8 that are disposed outside piece regions and become unnecessary after dicing. Thus it is not necessary to directly test the second connecting terminals 2 with probes, avoiding scratches on the second connecting terminals 2.

Figure 3A:
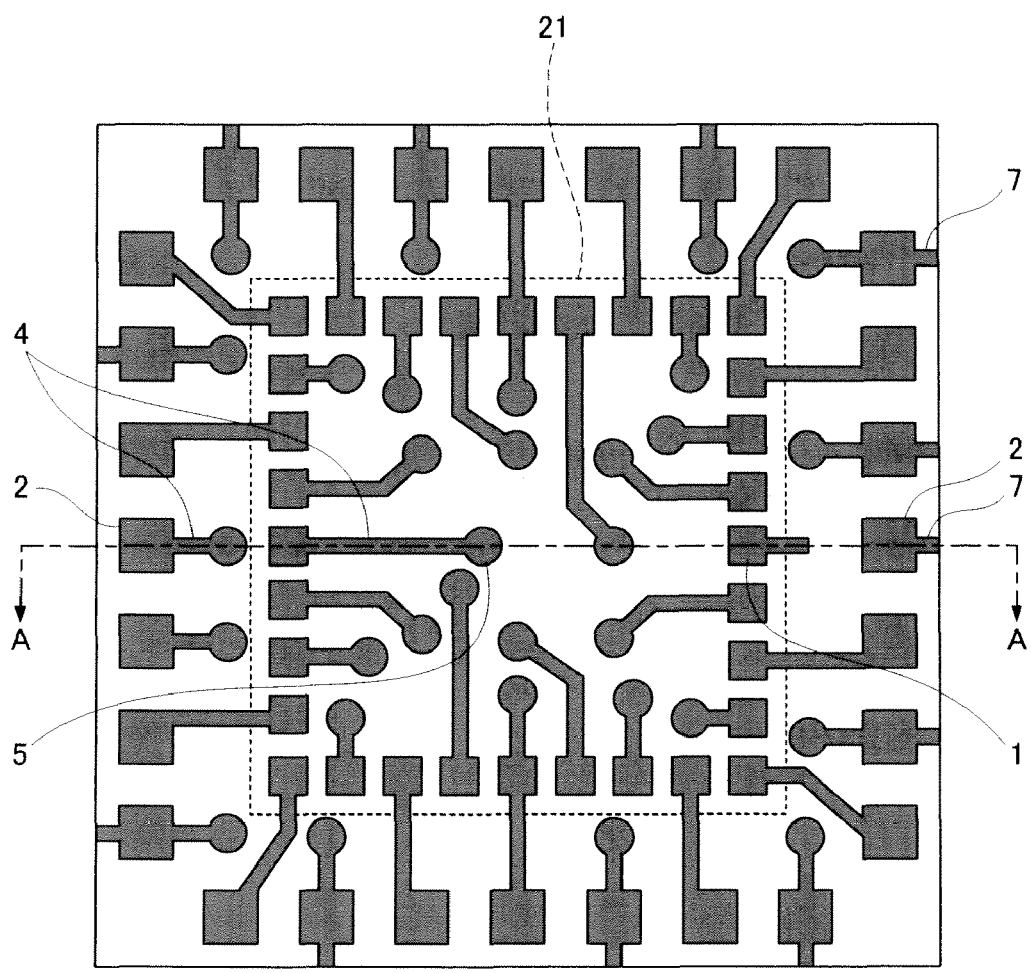
FIG. 3A is a plan view showing a piece of a substrate for wiring of a second example according to the first embodiment of the present invention.
Figure 3B:
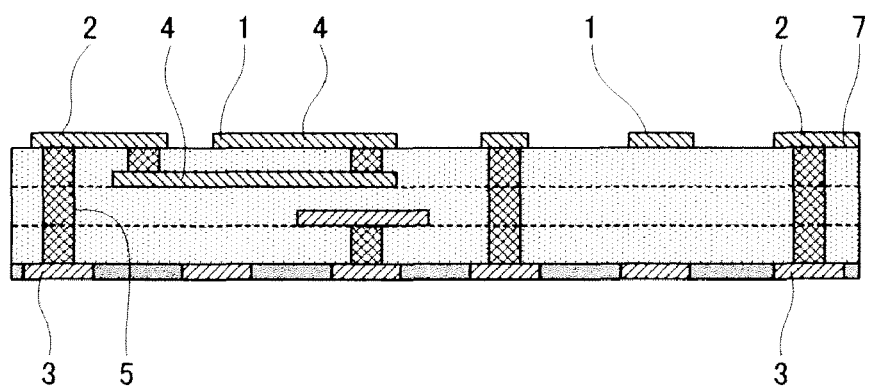
FIG. 3B is a sectional view showing the piece of the substrate for wiring of the second example.

FIGS. 3A and 3B show the configuration of a substrate for wiring according to a second example of the first embodiment. FIG. 3A is a plan view and FIG. 3B is a sectional view taken along arrow A-A of FIG. 3A. Also in FIG. 3B, the solder resist 6 is omitted from the surface layer of the substrate to simplify the illustration.

In FIGS. 3A and 3B, the substrate for wiring has a wiring path in which a connecting terminal 2 is connected to a point of a wiring path between a connecting terminal 1 and an external electrode terminal 3, and the first connecting terminal 1, the second connecting terminal 2, and the external electrode terminal 3 are connected in series. To wiring paths other than this configuration, test wires 7 are connected as in the first example.

As shown in FIG. 3B, the first connecting terminal 1, the second connecting terminal 2, and the external electrode terminal 3 are connected in series and this configuration ensures continuity from the first connecting terminal 1 to the second connecting terminal 2 and from the second connecting terminal 2 to the external connecting terminal 3 in a normal test conducted on a piece of the substrate after a semiconductor chip is mounted.

Thus tests may be conducted only on wiring paths not corresponding to the configuration where the first connecting terminal 1, the second connecting terminal 2, and the external electrode terminal 3 are connected in series, by bringing test probes into contact with a test terminal 8 and the external electrode terminal 3 before the substrate is divided.

Thus the number of test wires can be reduced, thereby suppressing an increase in the wiring density of the substrate. The number of test terminals (pads) can be also reduced, thereby reducing the cost of test.

Figure 4A:
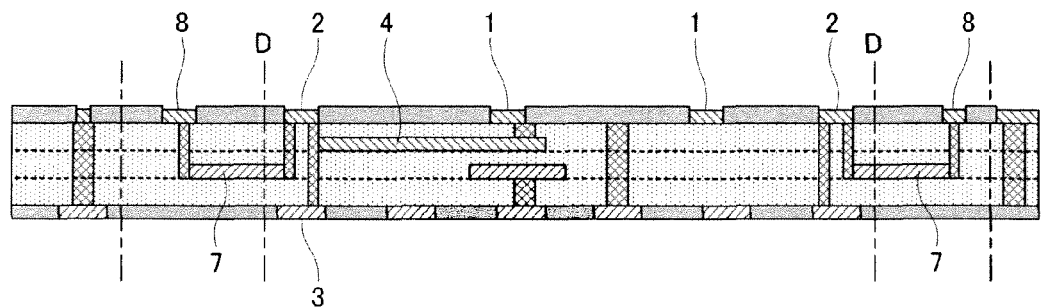
FIG. 4A is a plan view showing the configuration of a substrate for wiring of a third example according to the first embodiment of the present invention.
Figure 4B:
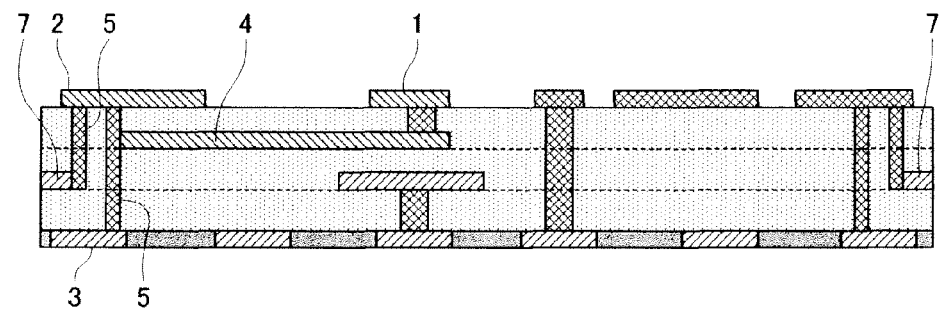
FIG. 4B is a sectional view showing a piece of the substrate for wiring of the third example.

FIGS. 4A and 4B show the configuration of a substrate for wiring according to a third example of the first embodiment. FIG. 4A is a sectional view of the substrate for wiring. FIG. 4B corresponds to D-D region of FIG. 4A and shows a sectional view after the substrate for wiring is divided. In FIG. 4B, solder resist on the surface layer of the substrate is omitted to simplify the illustration.

In FIGS. 4A and 4B, test wires 7 are present in inner layers of a piece obtained after dicing. The test wires 7 are directly connected to the wiring of the inner layers (regardless of the number of layers) from second connecting terminals 2 through vias 5. The vias 5 are provided in addition to vias 5 for directly connecting the second connecting terminals 2 and external electrode terminals 3.

With this configuration, in the manufacturing process and other handling of a semiconductor device using the substrate for wiring, it is possible to prevent the test wires 7 from being damaged by contact with external members, thereby reducing a probability that the test wires are damaged before a test and reduces a yield.

Figure 5:
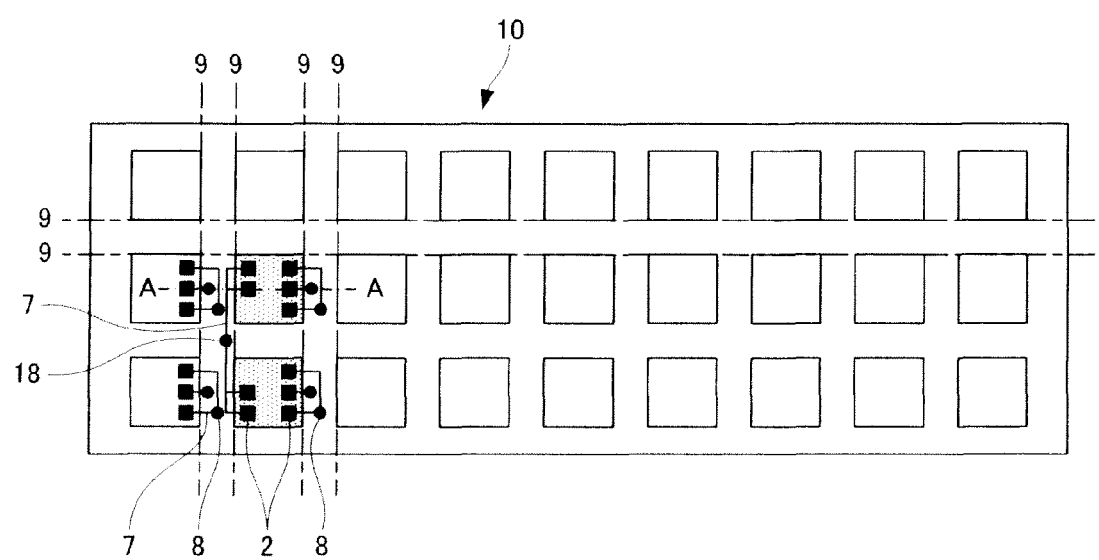
FIG. 5 is a plan view showing a substrate for wiring of a fourth example according to the first embodiment of the present invention.

FIG. 5 is a plan view showing the configuration of a substrate for wiring according to a fourth example of the first embodiment.

The configuration of the fourth example is different from the configuration of the first example in FIG. 1 in that test wires 7 of a plurality of pieces of a substrate 10 for wiring, in this case, the test wires 7 of two pieces are electrically connected to each other outside regions to be formed into the pieces after dicing on the substrate 10 for wiring and the test wires 7 drawn from the pieces are connected to a shared test terminal 18.

The shared test terminal 18 is electrically connected to external connecting terminals 3 of the pieces via the test wires 7, so that it is not necessary to provide a test terminal 8 for each of the pieces. The plurality of pieces can be collectively tested with the single shared test terminal 18 before the substrate for wiring is divided, so that the cost of test can be considerably reduced.

The test wires 7 may be electrolytically plated wires. Generally, in the case of electrolytic plating, the wiring of all the pieces includes plated lead wires. By using the plated lead wires, necessary portions are selected as test wires and are connected to test terminals, and then a test is conducted as described in the foregoing first to fourth examples.

Figure 6:
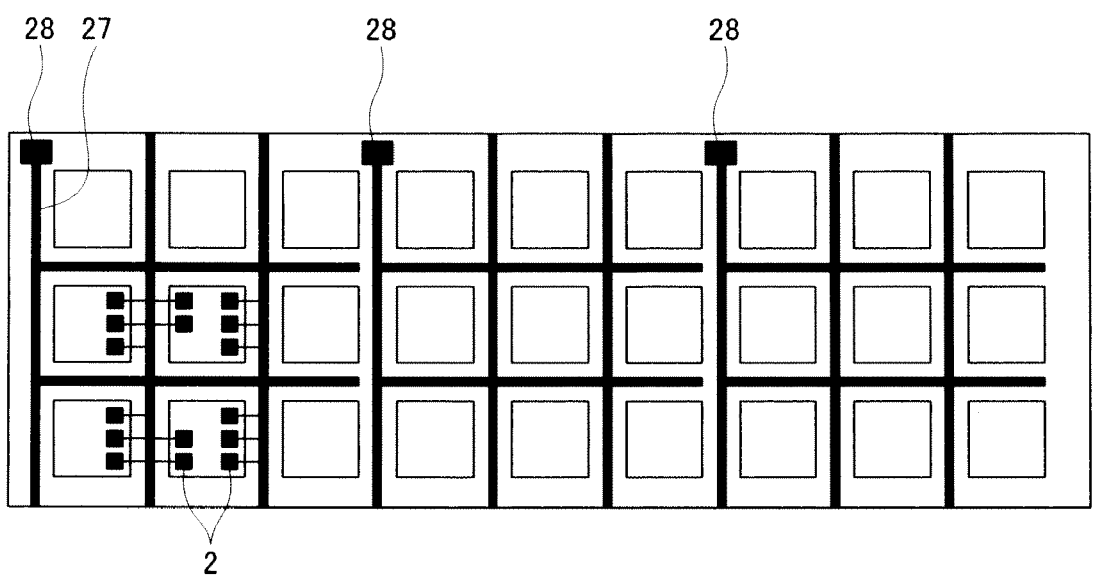
FIG. 6 is a plan view showing a substrate for wiring of a fifth example according to the first embodiment of the present invention.

The foregoing configuration is shown in FIG. 6 as a fifth example. In FIG. 6, a substrate 10 for wiring is made up of any number of pieces, in this case, nine pieces. Electroplated wires 27 from the pieces are properly combined and are short-circuited with a single test terminal 28 which is disposed outside a region to be formed into the piece after dicing. Continuity tests are conducted between the test terminals 28 and external electrode terminals 3 of the pieces.

With this configuration, plated lead wires may be selectively used for a substrate using electrolytic plating, without providing another test wires. Thus it is possible to suppress an increase in the cost of the substrate for wiring.

Second Embodiment

Figure 7A:
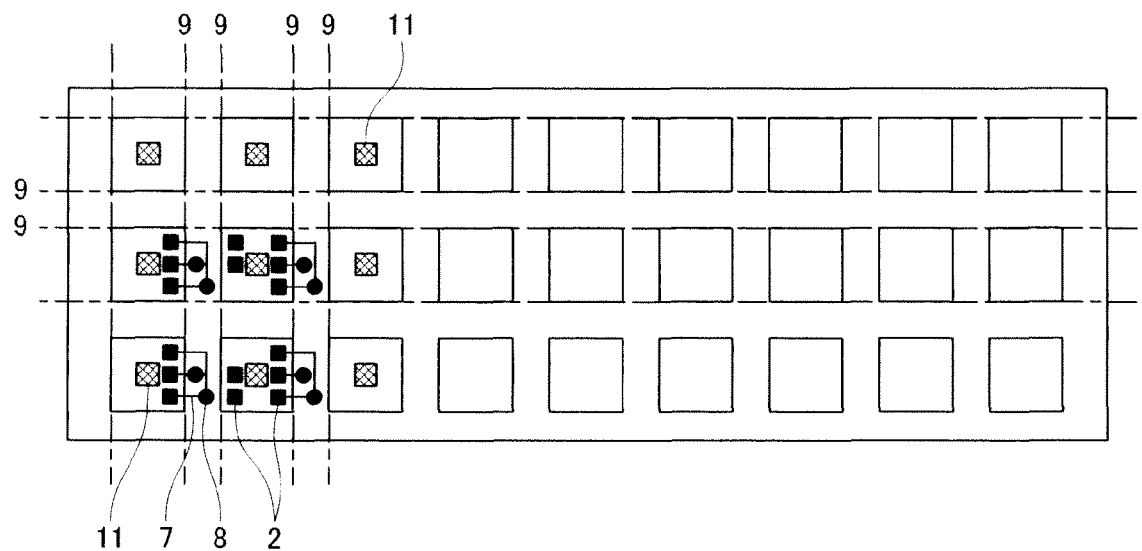
FIG. 7A is a plan view showing a semiconductor device for stacking according to a second embodiment of the present invention.
Figure 7B:
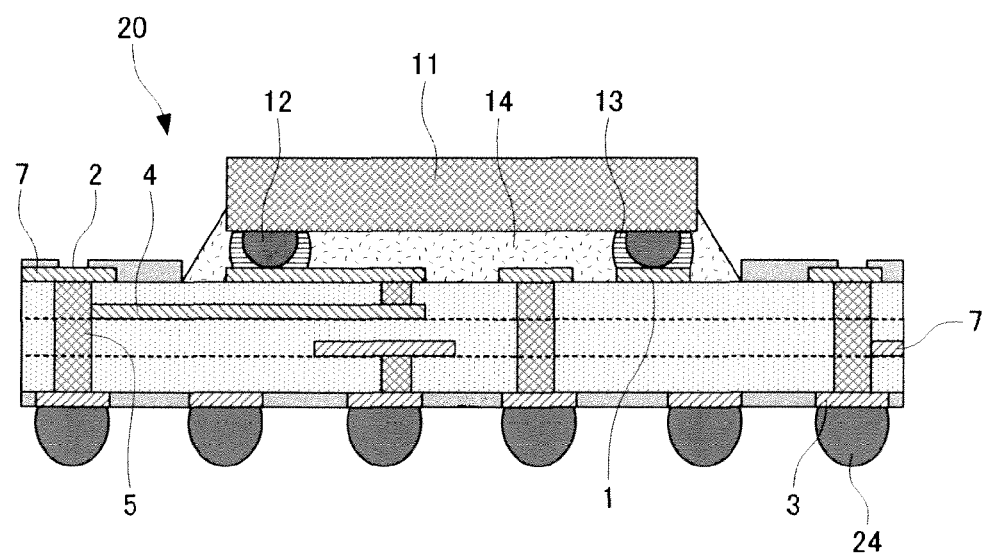
FIG. 7B is a sectional view showing a piece of the semiconductor device for stacking according to the second embodiment.

Referring to FIGS. 7A and 7B, the following will describe the steps of fabricating a semiconductor device for stacking using the substrate 10 configured thus for wiring. FIG. 7A is a plan view showing the substrate 10 for wiring on which a first semiconductor chip 11 is mounted. FIG. 7B is an enlarged view showing a piece of the substrate 10 for wiring on which the first semiconductor chip 11 is mounted.

First, the major surface of the first semiconductor chip 11 is opposed to first connecting terminals 1 formed on one surface of the substrate 10 for wiring. Next, the first connecting terminals 1 and protruding electrodes 12 of the first semiconductor chip 11 are aligned with each other, and are connected to each other with, for example, a conductive adhesive 13.

After that, underfill resin 14 is injected into a space to perform bonding and molding, so that the first semiconductor chip 11 is connected. Heat is preferably applied for curing the conductive adhesive 13 and the underfill resin 14.

The foregoing explanation described the connecting method of the semiconductor chip as an example and the connecting method is not particularly limited. For example, the protruding electrodes 12 may be connected by curing and shrinkage of a non-conductive resin film instead of the underfill resin 14. It is needless to say that other techniques such as general wire bonding may be used instead of flip-chip bonding.

Next, protruding electrodes 24 which are made of solder, gold, copper, or nickel and are shaped like balls or polygonal columns are bonded with, for example, solder (not shown) on external electrode terminals 3 which are arranged in a grid-like fashion over the other surface of the substrate 10 for wiring.

On the substrate 10 for wiring where the semiconductor chips 11 are mounted and the protruding electrodes 24 are formed on the external electrode terminals 3, continuity tests are conducted between test terminals 8 and the external electrode terminals 3.

After that, the substrate 10 for wiring is cut along dicing lines 9, so that a semiconductor device 20 for stacking is obtained as shown in FIG. 7B.

In the semiconductor device 20 for stacking, wiring paths from the external electrode terminals 3 to second connecting terminals 2 are electrically guaranteed beforehand by continuity tests conducted through the test terminals 8 before the semiconductor chip is stacked. Thus it is possible to provide a high-quality semiconductor device for stacking.

Since the surfaces of the second connecting terminals 2 are not brought into contact with probes in continuity tests, the surfaces of the second connecting terminals 2 are not scratched. As a result, when a second semiconductor device is mounted, a faulty connection does not occur or the reliability of connection does not decrease.

The semiconductor device 20 for stacking according to the present embodiment is properly used as a stacked semiconductor module in which a second semiconductor device is stacked and mounted via the second connecting terminals 2 as will be described later. The semiconductor device 20 for stacking may be used alone.

Figure 8:
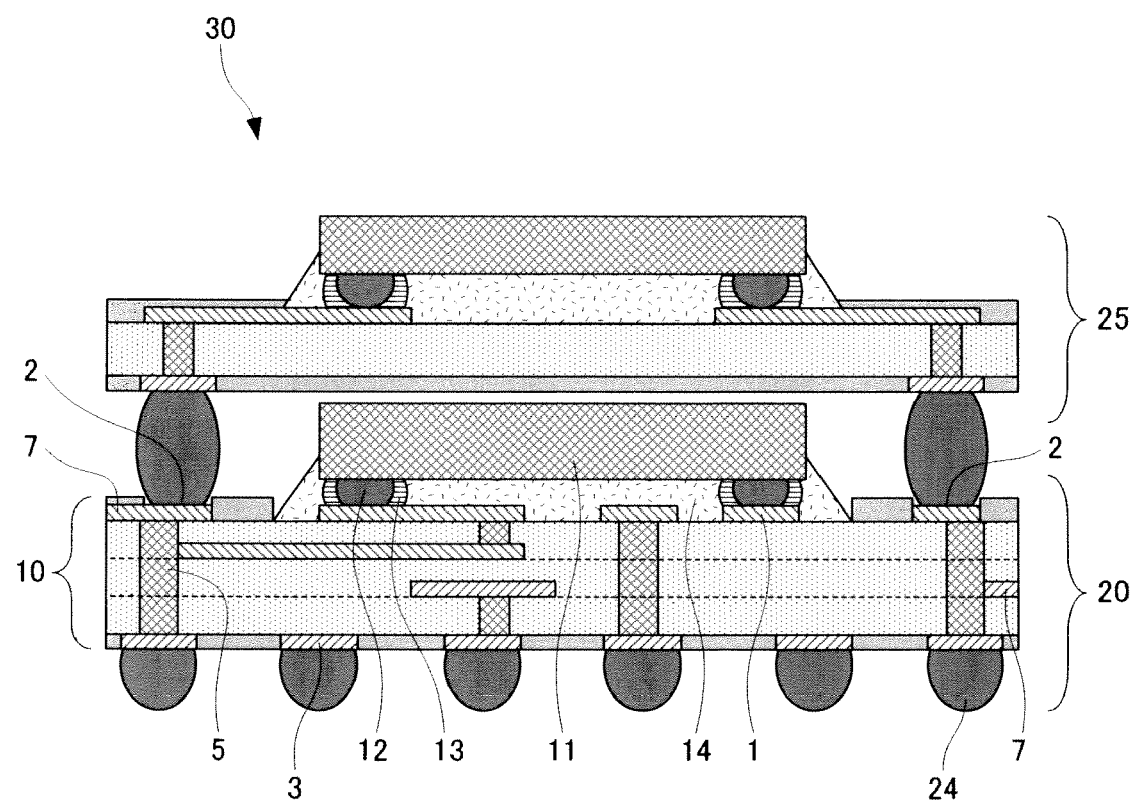
FIG. 8 is a sectional view showing a stacked semiconductor module according to the second embodiment of the present invention.

FIG. 8 is a sectional view showing the configuration of a stacked semiconductor module 30 of the present invention. On the semiconductor device 20 for stacking in FIG. 7B, a second semiconductor device 25 is mounted via second connecting terminals 2.

On substrates for wiring in the stacked semiconductor module 30, the main basic configuration of substrate wiring is identical to substrate wiring on the substrate 10 for wiring in FIGS. 1A and 1B.

First, in the semiconductor device 20 for stacking, the wiring paths from the external electrode terminals 3 to the second connecting terminals 2 are electrically guaranteed beforehand in a continuity test. Since the surfaces of the second connecting terminals 2 are not brought into contact with probes, the surfaces of the second connecting terminals 2 are not scratched. As a result, it is possible to provide the stacked semiconductor module 30 which can achieve reliable connection and few faulty connections.

INDUSTRIAL APPLICABILITY

Substrates for wiring, a semiconductor device for stacking using the substrates, and a stacked semiconductor module according to the present invention make it possible to inexpensively conduct a continuity test with high efficiency on connecting terminals for stacking during a function test before stacking, and achieve high-quality connections. Thus it is possible to suppress the occurrence of failures after stacking, achieving a higher manufacturing yield with lower cost. Consequently, the present invention is useful in the field of electronic equipment such as mobile phones and digital cameras which require small semiconductor modules with high functionality.

What is claimed is:
1. A semiconductor device, comprising:
a substrate having a side surface, a first surface and a second surface being opposed to the first surface;
a semiconductor chip; connecting terminals on the first surface of the substrate, the connecting terminals including first connecting terminals and second connecting terminals disposed outside the first connecting terminals in plan view;
external electrode terminals on the second surface of the substrate;
metal lines electrically connected to the second connecting terminals;
a solder resist disposed on the first surface of the substrate,
wherein the semiconductor chip is connected to the first surface of the substrate via the first connecting terminals, all of the first connecting terminals being disposed directly under the semiconductor chip,
the second connecting terminals are connected to another semiconductor device, and each of the metal lines is exposed from the side surface and the solder resist; and
wherein the metal lines include first metal lines and second metal lines, the first metal lines are disposed in same plane as the second connecting terminals, and the second metal lines are disposed under the connecting terminals.

2. A semiconductor device, comprising:
a substrate having a side surface, a first surface and a second surface being opposed to the first surface;
a semiconductor chip; connecting terminals on the first surface of the substrate, the connecting terminals including first connecting terminals and second connecting terminals disposed outside the first connecting terminals in plan view;
external electrode terminals on the second surface of the substrate; and
first and second metal lines electrically connected to the second connecting terminals,
wherein the semiconductor chip is connected to the first surface of the substrate via the first connecting terminals, all of the first connecting terminals being disposed directly under the semiconductor chip,
the second connecting terminals are connected to another semiconductor device,
the first metal lines are disposed on the first surface, and
the second metal lines are disposed in a layer of the substrate under the first surface; and
wherein each of the metal lines is exposed from the side surface of the substrate.

3. The semiconductor device according to claim 2, further comprising a solder resist disposed on the first surface of the substrate.

4. A semiconductor device, comprising:
a substrate having a side surface, a first surface and a second surface being opposed to the first surface;
a semiconductor chip;
connecting terminals on the first surface of the substrate, the connecting terminals including first connecting terminals and second connecting terminals disposed outside the first connecting terminals in plan view;
external electrode terminals on the second surface of the substrate; and
metal lines electrically connected to the second connecting terminals,
wherein the semiconductor chip is connected to the first surface of the substrate via the first connecting terminals, all of the first connecting terminals being disposed directly under the semiconductor chip,
the second connecting terminals are connected to other semiconductor device, and at least one of the metal lines extends from at least one of the second connecting terminals to the side surface of the substrate; and a resin covering at least a portion of a side surface of the semiconductor chip, wherein all of the second connecting terminals are disposed outside a peripheral edge of the resin.

5. The semiconductor device according to claim 4, wherein each of the metal lines is exposed from the side surface of the substrate.

6. The semiconductor device according to claim 4, wherein each of end portions of the metal lines lies in a substantially same plane.

7. The semiconductor device according to claim 4, wherein each of end portions of the metal lines forms a substantially straight line.

8. The semiconductor device according to claim 4, wherein each of the metal lines are connected to a test terminal.

9. The semiconductor device according to claim 8, wherein the test terminal is disposed outside a dicing line in the substrate, and after dividing the substrate along the dicing line into the semiconductor device, the test terminal is not a portion of the substrate in the semiconductor device.

10. The semiconductor device according to claim 4, further comprising a solder resist disposed on the first surface of the substrate.

11. The semiconductor device according to claim 4, further comprising only two metal layers including a first metal layer and a second metal layer over the first metal layer disposed between the connecting terminals and the external electrode terminals in the substrate.

12. The semiconductor device according to claim 11, wherein at least one of the first connecting terminals are connected to the first metal layer by a first via and at least one of the second connecting terminals are connected to the first metal layer by a second via, and the first via and the second via are disposed in a same layer.

13. The semiconductor device according to claim 4, wherein the metal lines are disposed between the connecting terminals and the external electrode terminals in the substrate.

14. The semiconductor device according to claim 4, wherein the metal lines include first metal lines and second metal lines, the first metal lines are disposed in same plane as the second connecting terminals, and the second metal lines are disposed under the connecting terminals.

15. The semiconductor device according to claim 4, wherein a width of each of the metal lines is smaller than half of a width of each of the second connecting terminals.

16. The semiconductor device according to claim 4, wherein at least one of the second connecting terminals are connected to the other semiconductor device by at least one of members, and a height of each of the members is larger than a height of each of the external electrode terminals.

* * * * *